United States Patent [19]
Adams et al.

[11] Patent Number: 5,802,070
[45] Date of Patent: Sep. 1, 1998

[54] TESTING ASSOCIATIVE MEMORY

[75] Inventors: Robert Dean Adams, Essex Junction; Kevin Arthur Batson, Williston; George Maria Braceras, Calchester; Fred John Towler, Essex Junction, all of Vt.

[73] Assignee: International Business Machines Corporation, Armonk, N.Y.

[21] Appl. No.: 725,390

[22] Filed: Oct. 3, 1996

[51] Int. Cl.$^6$ .................................................. G11C 29/00
[52] U.S. Cl. ............................ 371/21.1; 371/21.2; 365/49; 365/201
[58] Field of Search ........................ 371/21.1, 21.2; 365/189.01, 201, 49

[56] References Cited

U.S. PATENT DOCUMENTS

| | | | |
|---|---|---|---|
| 4,680,760 | 7/1987 | Giles et al. | 371/21 |
| 5,099,481 | 3/1992 | Miller | 371/22.1 |
| 5,107,501 | 4/1992 | Zorian | 371/213 |
| 5,132,973 | 7/1992 | Obermeyer | 371/21.1 |
| 5,138,619 | 8/1992 | Fasang et al. | 371/21.1 |
| 5,224,101 | 6/1993 | Popyack, Jr. | 371/21.1 |
| 5,258,986 | 11/1993 | Zerbe | 371/21.2 |
| 5,311,520 | 5/1994 | Raghavachari | 371/21.6 |
| 5,329,471 | 7/1994 | Swoboda et al. | 364/578 |
| 5,377,148 | 12/1994 | Rajsuman | 365/201 |
| 5,381,419 | 1/1995 | Zorian | 371/21.3 |
| 5,396,448 | 3/1995 | Takayanagi et al. | 365/49 |
| 5,436,910 | 7/1995 | Takeshima et al. | 371/21.1 |
| 5,535,164 | 7/1996 | Adams et al. | 365/201 |
| 5,563,833 | 10/1996 | Adams et al. | 365/201 |

*Primary Examiner*—Hoa T. Nguyen
*Attorney, Agent, or Firm*—Calfee, Halter & Griswold LLP

[57] ABSTRACT

A method of testing a first memory such as a RAM having data storage at a plurality of individually addressable storage locations is provided. A portion of the address for the addressable locations of the first memory is supplied as an output from a second memory such as a CAM. The second memory includes a decoder to provide a decoded address as input signals to the second memory. During the testing, first memory specific addresses are provided to the decoder as input. These first memory specific addresses are decoded by the decoder and are gated as input signals to address the first memory. In this way, the decoder which in normal operation provides decoded input signals to the CAM is used to provide input signals to the RAM, thus obviating the need for any scan chain latches surrounding the RAM. This enables conventional testing apparatus to provide the necessary test protocol for the RAM through the decoder normally used by the CAM.

7 Claims, 1 Drawing Sheet

TESTING ASSOCIATIVE MEMORY

RELATED APPLICATION

Application Ser. No. 08/398,465, filed Mar. 3, 1995, entitled "Using One Memory to Supply Addresses to an Associated Memory During Testing" (Attorney Docket No. BU9-95-001) now as U.S. Pat. No. 5,563,833.

FIELD OF THE INVENTION

The present invention relates generally to testing of associative memories, and more particularly to testing of memories where one memory is dependent for at least a portion of its input on a second or associated memory. In more particular aspects, this invention is specifically related to testing of memories, particularly with off-chip testers, such as RAMs which receive at least a portion of their input from other memories such as CAMs.

BACKGROUND INFORMATION

Testing of associated memories, particularly the RAM and CAMs described above formed on semiconductor substrates, has often been done by the provision of built-in self testers (BIST). Such BISTs include a state machine formed on the silicon substrate which contains the associative memories, and other VLSI circuit components such as logic components. Such a procedure for testing these such memories is shown in co-pending application, Ser. No. 08/398,465, filed Mar. 3, 1995, entitled "Using One Memory to Supply Addresses to an Associated Memory During Testing." This application describes how the CAM memory is used during testing to provide at least a portion of the input during testing of the RAM or data cache unit (DCU) memory in order to emulate or simulate as nearly as possible normal CPU read/write conditions for testing. While this testing may work very well for BIST testing wherein the specific tester, including the state machine and associated programming are embedded on the chip containing memory and therefore are specific therefor, nevertheless, such testing of the RAM using the CAM output is sometimes difficult or inefficient when an off-chip tester is to be used rather than a BIST. While it is possible to use an off-chip tester for generating the necessary test data for using the output of the CAM to test the DCU, nevertheless this presents certain peculiar problems and insufficiencies, although the use of the CAM to supply data during testing more nearly emulates actual conditions.

One alternative to the use of data from the CAM has often been to isolate each of the memories, including the RAM or DCU, with scan chain latches around the RAM into which the test data is loaded, thus avoiding the use of the CAM. This is especially useful in testing memories which are independent, small and don't have BISTs. However, this requires a separate set of latches at each RAM input, plus associated circuitry, such as multiplexors. While this provides a test of the associated memory, nevertheless, it requires significant additional surface area to the extent that the CAM and RAM must be physically separated and also has certain other drawbacks such as the possibility of loading the same data into two different scan chain latches, which will result in an invalid test.

Therefore, it is an object of the present invention to provide a technique for testing a first memory which is associated with a second memory without the need of surrounding the first memory with latches, which technique utilizes existing conventional circuitry normally associated with the memories to provide at least a portion of the signals for testing the first memory.

SUMMARY OF THE INVENTION

According to the present invention, a method of testing a first memory such as a RAM having data storage at a plurality of individually addressable storage locations is provided, and wherein at least a portion of the address for the addressable locations of the first memory is supplied as an output from a second memory such as a CAM, and wherein the second memory includes a decoder to provide a decoded address as input signals to the second memory. During the testing, first memory specific addresses are provided to the decoder as input. These first memory specific addresses are decoded by the decoder and are gated as input signals to address the first memory. In this way, the decoder which in normal operation provides decoded input signals to the CAM or second memory is used to provide input signals to the first memory, thus obviating the need for any scan chain latches surrounding the first memory and enabling the conventional off-chip testing machine to provide the necessary test protocol for the first memory through the decoder normally used by the second or CAM memory.

DESCRIPTION OF THE PREFERRED EMBODIMENT

Figure 1:
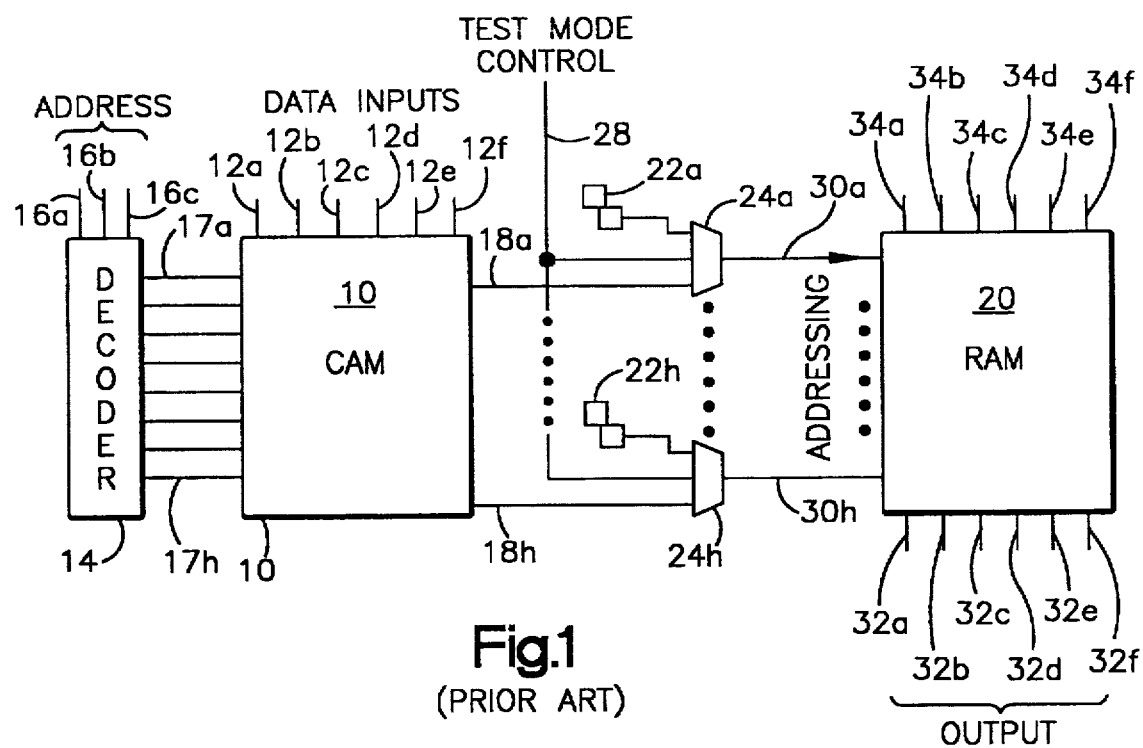
FIG. 1 is a diagrammatic representation of a prior art technique for testing one of two associated memories.

Referring now to the drawings, and for the present to FIG. 1, a prior art technique for testing a RAM or DCU memory which is associated with a CAM memory and receives at least a portion of the address during normal CPU operation from the CAM is shown. It is to be understood that this figure is representative of only one particular configuration involving two specific types of associated memories, which is but one of several possible connections of circuit components for functional operation and testing. Nevertheless, FIG. 1 represents a typical implementation of both operational and test paths for these types of associated memories.

The memory system shown in FIG. 1 includes a content addressable memory (CAM) 10, which receives data inputs 12a–12f which provide the data for comparison during normal read operations to the CAM 10. A decoder 14 is provided which has bit address inputs 16a, 16b and 16c. The address inputs 16a, 16b and 16c to the decoder 14 and outputs 17a–17h from the decoder provide the address information during a write operation to the CAM 10 for the data which is written to the CAM 10 by data inputs 12a–12f, and which stored data is used for comparison of the data inputs during normal read operations. The decoder decodes the three bit address on input 16a, 16b and 16c to a one of eight ($2_3$) output signals on outputs 17a–17h. A wider (or even narrower) bit address can be designed into the decoder and CAM, the output being one of $2^n$ where "n" is the number of bits in the address at 16a–16n.

The operation of a CAM memory is described in copending application, Ser. No. 08/398,465 and need not be described in detail here. However, the CAM shown in said application Ser. No. 08/398,465 is a CAM which has bit line addressable columns, as well as addressable rows. For simplicity, the present invention will be described with the use of a single column which does not require bit line addressing, but rather merely requires data inputs 12a–12f. It should also be understood that there can be more or less data bits input than the six data bits 12a–12f which are shown. Indeed, often the data width at 12a–12n is 32 bits or more wide. Nevertheless, the CAM memory 10 is shown for illustration purposes with a six bit wide data input field 12a–12f, and with eight rows ($2^3$) addressable as one of eight by CAM inputs 17a–17h.

In operation, the CAM 10 is loaded with specific data at each individual row. The address for the row is supplied by the address inputs 16a–16c to decoder 14 which is decoded and the data supplied by data bit line 12a–12f is stored at the decoded row location, depending upon the decoding of the address at 16a–16c. The address decoded will decode to output on the outputs 17a–17n to one of $2^n$ where "n" is the number of address bits supplied to the decoder 14. In the illustrated case, since there are three address bits, this will decode to one of $2^3$ or 8 outputs 17a–17h. Whatever data is to be stored within the decoded row is inputted from data bits 12a–12f.

During normal operation, data on the inputs 12a–12f are applied to the rows, and, if a match is found on any of the rows responsive to the inputs associated with 17a–17h, this row actuates or activates one of CAM outputs 18a–18h corresponding to the given row activated by the inputs associated with 12a–12f. Thus, if a match is found to the data bits, data bit inputs 12a–12f will actuate an output of one of the rows showing a match for one of the row outputs 18a–18h. This output is then applied to a RAM memory 20.

In the absence of separate testing, the outputs of the CAM could be supplied directly from the outputs 18a–18h to the RAM 20, and would correspond to a given row in the RAM which would cause a read-out of the data from that row. However, in certain prior art testing, and when the RAM is to be separately tested, it has been the practice to surround the RAM by scan chain latches 22 which are used to hold the address which is used to test the RAM. The scan chain latches 22a–22h, together with the CAM outputs 18a–18h, provide the inputs to multiplexors 24a–24h, respectively, thus allowing the gating of either the data in the scan chain latches 22a–22h or the actuation of output lines 18a–18h to be passed to the RAM 20. To this end, a test mode control signal 28 is supplied to each of the multiplexors 24a–24h which will supply the actuation to the multiplexors to allow either the test data from the scan latches 22a–22h to be applied on RAM input lines 30a–30h during testing, or to allow the data on lines 18a–18h to be applied to the RAM 20 on RAM input signal lines 30a–30h during operation. As described in the copending application, the particular line 30a–30h which activates the RAM causes the data on that row address to be read out on lines 32a–32f. This is also explained in the application Ser. No. 08/398,465. Data for the RAM 20 is inputted during write operation in both test mode and operating mode on data input lines 34a–34f.

As described above, the use of the scan latches 22a–22h is due to the fact that off-chip testers are not well suited to utilize the data within the CAM 10 to test the RAM 20 in an efficient manner. However, these scan latches 22a–22h require a significant amount of surface area and additional circuitry to be formed which is used merely for test purposes, and thus increases the area required for the operation of the CAM/RAM associative memory system. Moreover, in using scan chain latches rather than the output from the CAM, the possibility that the same data may be contained in more than one scan chain latch 22a–22h exists, in which case an invalid test results. Thus, it is desirable to provide a technique which allows for the testing of the RAM 20 without the necessity of using the data in the CAM 10 and also without the necessity of providing scan chain latches and associated multiplexors and circuitry for each of the outputs 18a–18h of the CAM 10.

Figure 2:
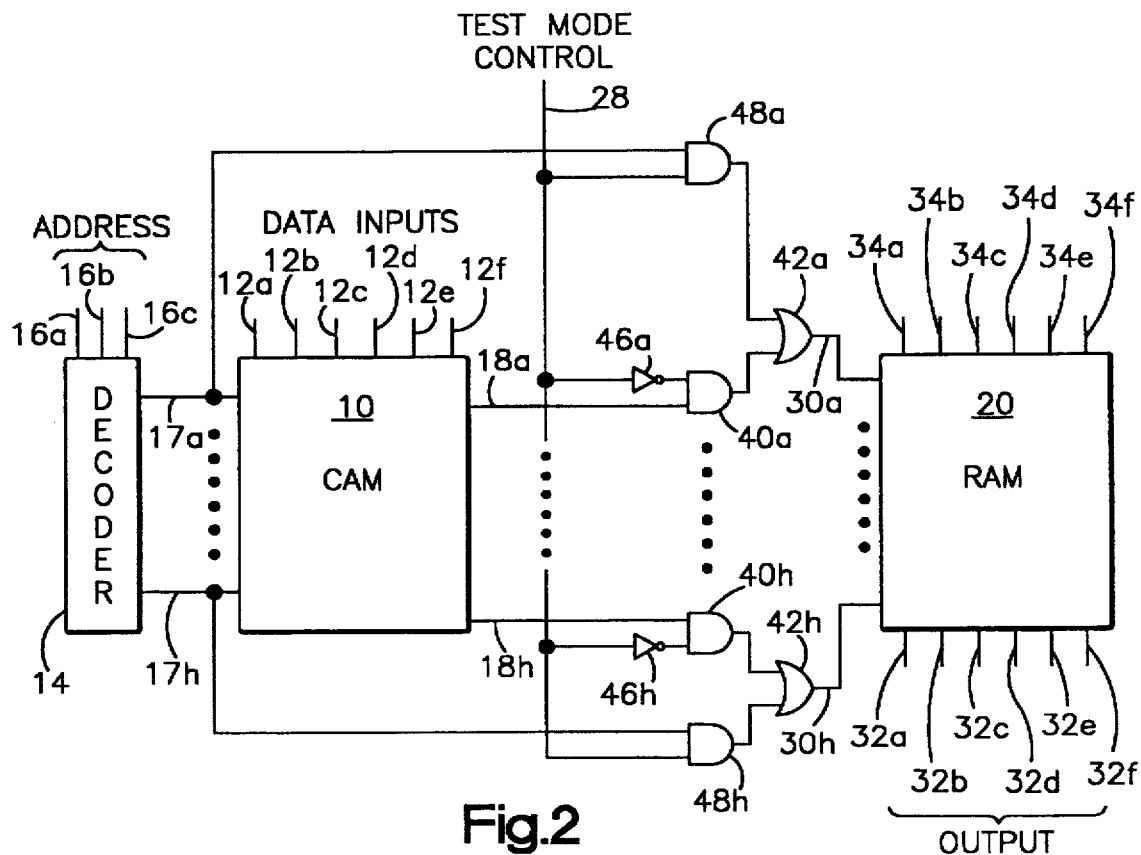
FIG. 2 is a diagrammatic representation of the testing of one of two associated memories according to the present invention.

Referring now to FIG. 2, a technique for testing the RAM 20 without using the data stored in the CAM 10 according to the present invention is shown. As is shown in FIG. 2, the CAM 10 as previously described provides the row address to the RAM 20; and the decoder 14 provides the input address to the CAM 10 for data being loaded to the CAM 10 during a write operation to the CAM 10 just as previously described. However, in the embodiment of FIG. 2, the outputs 18a–18h from the CAM 10 are provided as one input to AND gates 40a–40h, respectively, two of which 40a and 40h are shown, it being understood that each output 18a–18h has an associated AND gate 40a–40h, respectively. The output of the AND gates 40a–40h are provided as one input to OR gates 42a–42h, respectively (two of which, 42a and 42h, are shown), the outputs of which OR gates 42a–42h are outputted as the inputs 30a–30h, respectively, to the RAM 20. The other inputs to AND gates 40a–40h are provided from the test mode control signal 28 through inverters 46a–46h, respectively, two of which, 46a and 46h, are shown. The test mode control signal 28 is also provided as one input to each of AND gates 48a–48h. The other input to each of the AND gates 48a–48h is provided respectively from the outputs 17a–17h from the decoder 14 through line 49a–49h respectively, two of which, 49a and 49h, are shown. The output from the AND gates 48a–48h are provided as the other inputs to OR gates 42a–42h, respectively.

The operation of the device in FIG. 2 during normal read/write operations of the CAM 10 and RAM 20 (i.e., not testing but normal CPU operations) is as follows. During a write operation to the CAM 10, the data bits are supplied on lines 12a–12f, and the row address in the CAM 10 at which the data is to be stored is supplied through the address input lines 16a–16c, which is decoded to output on one of lines 17a–17h as previously described. Data is also loaded into the RAM in a conventional manner. During a read operation during normal CPU operations, the address decoder is not used, but data is provided on the data inputs 12a–12f; and if a match is found on any of the eight lines in the CAM corresponding to inputs 17a–17h, the corresponding output line 18a–18h is actuated, delivering a signal to the respective AND gate 40a–40h. During normal operation, the test mode control line 28 is held LOW, and thus inverters 46a–46h provide a HIGH signal to each of the AND gates 40a–40h. The respective AND gate 40a–40h which has received a HIGH signal from the respective output lines 18a–18h goes HIGH, delivering an output signal from the appropriate AND gate 40a–40h to the appropriate OR gate 42a–42h. Since, as just described, during normal operations, the test mode control line 28 is LOW, the outputs from all of the AND gates 48a–48h are also LOW, and thus the only HIGH input to the OR gates 42a–42h is from the one active output line 18a–18h of the CAM, thus actuating the respective input line 30a–30h to the RAM causing the data on the row corresponding to the input 30a–30h to read out. This is the operation of a device in a conventional or normal CPU read mode.

During the operation of the CAM 10 and RAM 20 during a test mode, the data stored in the CAM is not utilized for test purposes. The test data during the read mode 18 supplied to the RAM in the following way. The address corresponding to the particular row 30a–30h in the RAM 20 which is to be read is supplied to the decoder 14. (It should be noted that this is not related to any data or row within the CAM 10 during test mode.) The address supplied to the decoder on address lines 16a–16c is decoded to one of the eight outputs 17a–17h. The output lines 17a–17h are connected as one input to AND gates 48a–48h. During test mode, the test mode control line 28 is held HIGH and thus each of the AND gates 48a–48h has one HIGH input. Depending on which of the lines 17a–17h is decoded from the address to go HIGH, that particular AND gate 48a–48h will provide a signal to the respective OR gate 42a–42h, which will provide an output corresponding to one of inputs 30a–30h to the RAM, this input corresponding to the address provided on the lines 16a–16c of the decoder 14. Since during test mode, test mode control line 28 is held HIGH because of the inverters 46a–46h, respectively, AND gates 40a–40h are inactive and thus the only inputs to the OR gates 42a–42h during test modes are from the respective AND gate 48a–48h. The output of the OR gates 42a–42h respectively provide the inputs on signal lines 30a–30h to the RAM 20, which outputs the data contained on the respective row corresponding to the inputs 30a–30h on output 32.

Thus, it will be understood that the decoder 14, during normal computer operation, is used only to decode the address of information to be written to the CAM during a CPU write operation to the CAM, but is used on a read cycle during test to read the data stored at the particular row location 30a–30h in the RAM. The decoder 14 can also be used during write operations of test data to the RAM 20 in the same way it is used in a read operation of test data from the RAM 20.

There are several benefits which are obtained from the technique of the present invention as shown in FIG. 2 as opposed to the technique of the prior art as shown in FIG. 1 and as described in application Ser. No. 08/398,465. First, with respect to the devices shown in FIG. 1, a significant amount of area is saved since the amount of area required by the gates 48a, 40a and 42a, etc., is a lot less than the area required by the scan chain latches 22a, etc., and multiplexor 24a, etc., of FIG. 1. Indeed, scan latches 22 take up significantly more area than the gates 48 and 40, and thus the gates 40, 42 and 48 can be located at the margin of the CAM or RAM, thus allowing the CAM and RAM to be physically adjacent, although they are shown separately for illustrative purposes in FIG. 2. Moreover, the error condition of having the same address location contained in more than one of the scan latches 22a–22h is obviated since a specific address is decoded by the decoder 14 and thus can be applied as only one input 30a–30h to the RAM 20. The present invention also provides a benefit over the technique shown in application Ser. No. 08/398,465 inasmuch as the inefficiency encountered when an off-chip tester is used to provide the data to the CAM for testing the RAM is obviated.

Accordingly, the preferred embodiment of the present invention has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A method of testing a first memory having a data storage at a plurality of individually addressable storage locations, each location having an individual address, and at least a portion of the individual addresses for the storage locations to be accessed during a normal read/write cycle being supplied as an output from a second memory, and wherein said second memory has a decoder associated therewith to provide decoded addresses as input signals to said second memory, comprising the steps of: during a testing cycle:

providing first memory specific addresses as inputs to said decoder;

decoding each said first memory specific address in said decoder; and providing the output of said decoder as input signals representing/as said at least a portion of the individual addresses to be accessed to said first memory;

wherein said step of providing the output of said decoder comprising using said decoder to generate input signals directly, not through the second memory to said first memory during the testing cycle.

2. The method of claim 1 wherein said first memory is a RAM and said second memory is a CAM.

3. The method of claim 1 wherein said first memory specific address is a read address to be accessed during a read cycle.

4. The method of claim 1 wherein said testing is performed on both a read cycle and a write cycle.

5. An apparatus for testing a first memory having a data storage at a plurality of individually addressable storage locations, each location having an individual address, and at least a portion of the individual addresses for the storage locations to be accessed during a normal read/write cycle being supplied as an output from a second memory, and wherein said second memory has a decoder associated therewith to provide decoded addresses as input signals to said second memory comprising:

first circuitry to selectively provide first memory and second memory specific addresses as inputs to said decoder;

second circuitry to selectively provide the outputs of said decoder as input signals representing said at least a portion of the individual addresses to be accessed directly, not through the second memory to said first memory when said addresses are first memory specific during a testing cycle and to selectively provide the outputs of said decoder as input signals representing said at least a portion of the individual addresses to be accessed through said second memory to said first memory when said addresses are second memory specific during a normal read/write cycle;

wherein said second circuit includes logic associated with said decoder for generating input signals to said first memory during a testing cycle and input signals directly, not through the second memory to said first memory through said second memory during normal read/write cycles.

6. The device of claim 5 wherein said first memory is a RAM and said second memory is a CAM.

7. The device of claim 5 wherein said circuitry to select the output of said decoder includes logic gates.

* * * * *